United States Patent
Frey et al.

(10) Patent No.: US 8,247,683 B2
(45) Date of Patent: Aug. 21, 2012

(54) THIN FILM INTERLAYER IN CADMIUM TELLURIDE THIN FILM PHOTOVOLTAIC DEVICES AND METHODS OF MANUFACTURING THE SAME

(75) Inventors: Jonathan Mack Frey, Denver, CO (US); Robert Dwayne Gossmann, Aurora, CO (US); Mehran Sadeghi, Orpington (GB); Scott Daniel Feldman-Peabody, Golden, CO (US); Jennifer A. Drayton, Golden, CO (US); Victor Kaydanov, Lakewood, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 286 days.

(21) Appl. No.: 12/639,037

(22) Filed: Dec. 16, 2009

(65) Prior Publication Data
US 2011/0139245 A1   Jun. 16, 2011

(51) Int. Cl.
*H01L 31/0296* (2006.01)
*H01L 31/0336* (2006.01)

(52) U.S. Cl. .................. 136/255; 136/260; 136/264

(58) Field of Classification Search ........... 136/243–265
See application file for complete search history.

(56) References Cited

U.S. PATENT DOCUMENTS

| | | | | |
|---|---|---|---|---|
| 4,611,091 A * | 9/1986 | Choudary et al. | ............ | 136/260 |
| 5,100,478 A * | 3/1992 | Kawabata | ............ | 136/249 |
| 5,393,675 A | 2/1995 | Compaan | | |
| 5,569,332 A * | 10/1996 | Glatfelter et al. | ............ | 136/249 |
| 5,738,731 A * | 4/1998 | Shindo et al. | ............ | 136/249 |
| 6,169,246 B1 * | 1/2001 | Wu et al. | ............ | 136/265 |
| 6,255,708 B1 | 7/2001 | Sudharsanan et al. | | |
| 2004/0187914 A1 * | 9/2004 | Matsuda et al. | ............ | 136/255 |
| 2008/0092945 A1 * | 4/2008 | Munteanu et al. | ............ | 136/252 |
| 2008/0251119 A1 | 10/2008 | Forehand | | |
| 2009/0165839 A1 | 7/2009 | Zeman et al. | | |
| 2009/0194165 A1 | 8/2009 | Murphy et al. | | |
| 2009/0242029 A1 | 10/2009 | Paulson et al. | | |

* cited by examiner

*Primary Examiner* — Jonathan Johnson
*Assistant Examiner* — Christina Chern
(74) *Attorney, Agent, or Firm* — Dority & Manning, P.A.

(57) ABSTRACT

A cadmium telluride thin film photovoltaic device is provided having a thin film interlayer positioned between a cadmium sulfide layer and a cadmium telluride layer. The thin film interlayer can be an oxide thin film layer (e.g., an amorphous silica layer, a cadmium stannate layer, a zinc stannate layer, etc.) or a nitride film, and can act as a chemical barrier at the p-n junction to inhibit ion diffusion between the layers. The device can include a transparent conductive layer on a glass superstrate, a cadmium sulfide layer on the transparent conductive layer, a thin film interlayer on the cadmium sulfide layer, a cadmium telluride layer on the thin film interlayer, and a back contact on the cadmium telluride layer. Methods are also provided of manufacturing such devices.

14 Claims, 2 Drawing Sheets

THIN FILM INTERLAYER IN CADMIUM TELLURIDE THIN FILM PHOTOVOLTAIC DEVICES AND METHODS OF MANUFACTURING THE SAME

FIELD OF THE INVENTION

The subject matter disclosed herein relates generally to cadmium telluride thin film photovoltaic devices. More particularly, the subject matter disclosed herein relates to cadmium telluride thin film photovoltaic devices having a thin film interlayer between a cadmium sulfide layer and a cadmium telluride layer.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer). Free carrier pairs are created by light energy and then separated by the p-n heterojunction to produce an electrical current. This p-n heterojunction is defined by the intermixing of the CdTe layer and the CdS layer at the junction, allowing this heterojunction to be characterized by the chemical formula $CdTe_{1-x}S_x$ along the junction surface of the CdTe layer and $CdS_{1-x}Te_x$ along the junction surface of the CdS layer. As such, the heterojunction between the CdTe layer and the CdS layer can be described as a mixed combination of the layers.

This intermixing of the CdTe layer and the CdS layer at the junction can, however, lead to undesired diffusion of ions and/or dopants between the CdTe layer and the CdS layer that can decrease the efficiency and/or lifetime of the device. For example, copper dopants added to the CdTe layer can diffuse over time across the heterojunction and into the CdS layer, leading to reduced efficiency and/or lifetime of the device.

Thus, a need exists for cadmium telluride photovoltaic devices having improved energy conversion efficiency and/or device lifetime through reduced dopant and/or ion diffusion between the CdTe layer and the CdS layer and aiding in reducing recombination of generated carriers at the interface of the CdTe layer and the CdS layer.

BRIEF DESCRIPTION OF THE INVENTION

Aspects and advantages of the invention will be set forth in part in the following description, or may be obvious from the description, or may be learned through practice of the invention.

Cadmium telluride thin film photovoltaic devices are generally provided having a thin film interlayer positioned between a cadmium sulfide layer and a cadmium telluride layer. The thin film interlayer can be an oxide thin film layer (e.g., an amorphous silica layer, a cadmium stannate layer, a zinc stannate layer, etc.) or a nitride film.

In one particular embodiment, the cadmium telluride thin film photovoltaic device can include a transparent conductive layer on a glass superstrate, a cadmium sulfide layer on the transparent conductive layer, a thin film interlayer on the cadmium sulfide layer, a cadmium telluride layer on the thin film interlayer, and a back contact on the cadmium telluride layer.

Methods of manufacturing a cadmium telluride thin film photovoltaic device are also provided through forming a thin film interlayer over a cadmium sulfide layer, then forming a cadmium telluride layer over the thin film layer. For example, the thin film interlayer can be formed by sputtering, evaporation, chemical vapor deposition, chemical bath deposition, or other techniques of forming a film layer.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Generally speaking, a cadmium telluride thin film photovoltaic device is presently disclosed having a thin film interlayer positioned between a cadmium telluride layer and a cadmium sulfide layer, along with methods of its manufacture. The thin film interlayer can affect the electric field distribution within the p-n junction formed by the cadmium telluride layer and the cadmium sulfide layer. Additionally, the thin film interlayer can reduce the effect of recombination at the interface of the cadmium telluride layer and the cadmium sulfide layer. The thin film interlayer can also limit impurity, ion, and/or dopant diffusion across the interface from the cadmium telluride layer to the cadmium sulfide layer, and vice versa. In this manner, the thin film interlayer can act as a chemical barrier between the cadmium telluride layer and cadmium sulfide layer. As a result, the presence of the thin film interlayer can increase performance and/or long term stability of the cadmium telluride thin film photovoltaic device. The presence of the thin film interlayer can also increase the efficiency of the CdTe PV module.

The thin film interlayer can include any chemical barrier material that can inhibit the diffusion of ions between the cadmium telluride layer and cadmium sulfide layer. For example, the thin film interlayer can include an oxide thin film interlayer, which may be an oxide of Si—, Zn—, Sn—, Te—, Mg—, Cd—, Ti—, Hf—, Li—, or Zr—, or combinations thereof. In one embodiment, the thin film interlayer can include a zinc stannate thin film interlayer and/or a cadmium stannate thin film interlayer. The thin film interlayer can include a dopant(s) or can be undoped.

The thickness of the thin film interlayer can be configured to adjust and tailor the interaction and/or chemical diffusion between the cadmium telluride layer and the cadmium sulfide. For example, the thin film interlayer can have a thickness from about 1 nm and about 10 μm, such as from about 10 nm to about 5 μm. In certain embodiments, the thickness of the thin film interlayer can be relatively large (e.g., greater than about 1 μm, for example from about 1 μm to about 5 μm) in order to substantially prevent diffusion between the cadmium telluride and cadmium sulfide layers. In alternative embodiments, the thickness of the amorphous silica thin film interlayer can be relatively small (e.g., less than about 1 μm, for example between about 10 nm and about 500 nm, such as from about 50 nm to about 250 nm) so as to control the diffusion between the cadmium telluride and cadmium sulfide layers to tailor the resulting device.

When formed from cadmium stannate and/or zinc stannate, the thin film interlayer can have a thickness less than about 100 nm in particular embodiments, for example from about 1 nm and about 75 nm, such as from about 5 nm to about 50 nm or from about 10 nm to about 25 nm. In one embodiment, the thin film interlayer can have a thickness between about 1 nm and about 10 nm.

In one particular embodiment, the thin film interlayer can be an oxide thin film interlayer including amorphous silicone dioxide forming an amorphous silica thin film interlayer. Such an amorphous silica thin film interlayer can inhibit dopant and ion diffusion between the cadmium telluride layer and the cadmium sulfide layer to create a chemical barrier at the junction, instead of a heterojunction that would normally form between adjacent cadmium telluride and the cadmium sulfide layers. Additionally, the amorphous silica thin film interlayer may also generate electron hole pairs for use in the junction between the cadmium telluride layer and the cadmium sulfide layer. The thickness of the amorphous silica thin film interlayer can be configured to adjust and tailor the chemical interaction and/or ion diffusion between the cadmium telluride layer and the cadmium sulfide thin film interlayer. For example, the thickness of the thin film interlayer including amorphous silica can be between about 1 nm and about 10 μm, such as from about 10 nm to about 5 μm. In certain embodiments, the thickness of the thin film interlayer including amorphous silica can be relatively large (e.g., greater than about 1 μm, for example from about 1 μm to about 5 μm) in order to substantially prevent diffusion between the cadmium telluride and cadmium sulfide layers. In alternative embodiments, the thickness of the amorphous silica thin film interlayer can be relatively small (e.g., less than about 1 μm, for example between about 10 nm and about 500 nm, such as from about 50 nm to about 250 nm) so as to control the diffusion between the cadmium telluride and cadmium sulfide layers to tailor the resulting device.

The film interlayer can be included in any cadmium telluride device that includes a cadmium sulfide layer and a cadmium telluride layer, such as in the cadmium telluride thin film photovoltaic device disclosed in U.S. Publication No. 2009/0194165 of Murphy, et al. titled "Ultra-high Current Density Cadmium Telluride Photovoltaic Modules."

Figure 1:
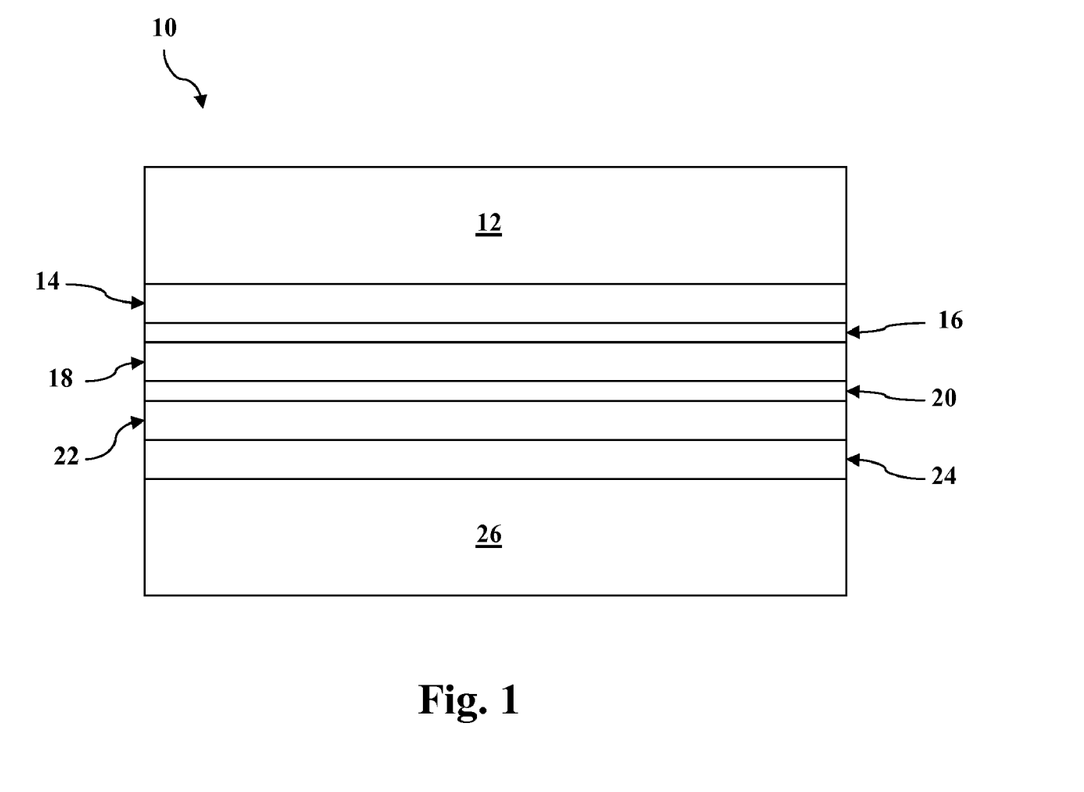
FIG. 1 shows a general schematic of a cross-sectional view of an exemplary cadmium telluride thin film photovoltaic device according to one embodiment of the present invention.

FIG. 1 represents an exemplary cadmium telluride thin film photovoltaic device 10 having a thin film interlayer 20 positioned between a cadmium sulfide layer 18 and a cadmium telluride layer 22. The exemplary device 10 of FIG. 1 includes a top sheet of glass 12 employed as the substrate. In this embodiment, the glass 12 can be referred to as a "superstrate", as it is the substrate on which the subsequent layers are formed even though it faces upward to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmissiveness of about 0.9 or greater in the spectrum of interest (e.g., wavelengths from about 300 nm to about 900 nm).

A transparent conductive oxide (TCO) layer 14 is shown on the glass 12 of the exemplary device 10 of FIG. 1. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pryolysis, or any other suitable deposition method. In one particular embodiment, the TCO layer 14 can be formed by sputtering (e.g., DC sputtering or RF sputtering) on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 μm and about 1 μm, for example from about 0.1 μm to about 0.5 μm, such as from about 0.25 μm to about 0.35 μm. Suitable flat glass substrates having a TCO layer 14 formed on the superstrate surface can be purchased commercially from various glass manufactures and suppliers. For example, a particularly suitable glass 12 including a TCO layer 14 includes TEC 15 glass commercially available under the name TEC 15 TCO from Pilkington North America Inc. (Toledo, Ohio), which includes a TCO layer having a sheet resistance of 15 ohms per square.

A resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 22. Thus, it is believed that the RTB layer 16 allows for improved adhesion and/or interaction between the TCO layer 14 and the cadmium telluride layer 22, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering (e.g. DC sputtering or RF sputtering) on the TCO layer 14 (as discussed below in greater detail with respect to the deposition of the cadmium sulfide layer 18). For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

A cadmium sulfide layer 18 is shown on RTB layer 16 of the exemplary device 10 of FIG. 1. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering (e.g., direct current (DC) sputtering or radio frequency (RF) sputtering) on the RTB layer 16. Sputtering deposition generally involves ejecting material from a target, which is the material source, and depositing the ejected material onto the substrate to form the film. DC sputtering generally involves applying a direct current to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. The current applied to the source material can vary depending on the size of the source material, size of the sputtering chamber, amount of surface area of substrate, and other variables. In some embodiments, the current applied can be from about 2 amps to about 20 amps.

Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the RTB layer 16, the cadmium sulfide layer 18 can have a thickness that is less than about 0.1 μm, such as between about 10 nm and about 100 nm, such as from about 50 nm to about 80 nm, with a minimal presence of pinholes between the TCO layer 14 and the cadmium sulfide layer 18. Additionally, a cadmium sulfide layer 18 having a thickness less than about 0.1 μm reduces any absorption of radiation energy by the cadmium sulfide layer 18, effectively increasing the amount of radiation energy reaching the underlying cadmium telluride layer 22.

The thin film interlayer 20 discussed in greater detail above is shown on the cadmium sulfide layer 18 in the exemplary cadmium telluride thin film photovoltaic device 10 of FIG. 1. This thin film interlayer 20 is shown in direct contact with and positioned between the cadmium sulfide layer 18 and the cadmium telluride layer 22.

A cadmium telluride layer 22 is shown on the thin film interlayer 20 in the exemplary cadmium telluride thin film photovoltaic device 10 of FIG. 1. The cadmium telluride layer 22 is a p-type layer that generally includes cadmium telluride (CdS) but may also include other materials. As the p-type layer of device 10, the cadmium telluride layer 22 is the photovoltaic layer that interacts with the cadmium sulfide layer 18 (i.e., the n-type layer) to produce current from the absorption of radiation energy by absorbing the majority of the radiation energy passing into the device 10 due to its high absorption coefficient and creating electron-hole pairs. For example, the cadmium telluride layer 22 can generally be formed from cadmium telluride and can have a bandgap tailored to absorb radiation energy (e.g., from about 1.4 eV to about 1.5 eV, such as about 1.45 eV) to create electron-hole pairs upon absorption of the radiation energy. Holes may travel from the p-type side (i.e., the cadmium telluride layer 22) across the junction to the n-type side (i.e., the cadmium sulfide layer 18) and, conversely, electrons may pass from the n-type side to the p-type side. Thus, the p-n junction formed between the cadmium sulfide layer 18 and the cadmium telluride layer 22 forms a diode-like material that allows conventional current to flow in only one direction to create a charge imbalance across the boundary. This charge imbalance leads to the creation of an electric field spanning the p-n junction and separating the freed electrons and holes. Without wishing to be bound by theory, it is presently believed that the thin film interlayer 20 of the device 10 can allow the electrons and holes to move between the cadmium sulfide layer 18 and the cadmium telluride layer 22 while inhibiting the diffusion of larger materials (e.g., ions and other impurities or dopants).

The cadmium telluride layer 22 can be formed by any known process, such as chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 22 is deposited by close-space sublimation. In particular embodiments, the cadmium telluride layer 22 can have a thickness between about 0.1 μm and about 10 μm, such as from about 1 μm and about 5 μm. In one particular embodiment, the cadmium telluride layer 22 can have a thickness between about 2 μm and about 4 μm, such as about 3 μm.

A series of post-forming treatments can be applied to the exposed surface of the cadmium telluride layer 22. These treatments can tailor the functionality of the cadmium telluride layer 22 and prepare its surface for subsequent adhesion to the back contact layer(s) 24. For example, the cadmium telluride layer 22 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 22 (and the device 10) converts the normally n-type cadmium telluride layer 22 to a p-type cadmium telluride layer 22 having a relatively low resistivity. The cadmium telluride layer 22 can also recrystallize and undergo grain growth during annealing.

Annealing the cadmium telluride layer 22 can be carried out in the presence of cadmium chloride in order to dope the cadmium telluride layer 22 with chloride ions. For example, the cadmium telluride layer 22 can be washed with an aqueous solution containing cadmium chloride and then annealed at the elevated temperature.

In one particular embodiment, after annealing the cadmium telluride layer 22 in the presence of cadmium chloride, the surface can be washed to remove any cadmium oxide formed on the surface. This surface preparation can leave a Te-rich surface on the cadmium telluride layer 22 by removing cadmium oxide from the surface. For instance, the surface can be washed with a suitable solvent (e.g., ethylenediamine also known as 1,2 diaminoethane or "DAE") to remove any cadmium oxide on the surface.

Additionally, copper can be added to the cadmium telluride layer 22. Along with a suitable etch, the addition of copper to the cadmium telluride layer 22 can form a surface of copper-telluride on the cadmium telluride layer 22 in order to obtain a low-resistance electrical contact between the cadmium telluride layer 22 (i.e., the p-type layer) and the back contact layer(s). Specifically, the addition of copper can create a surface layer of cuprous telluride ($Cu_2Te$) between the cadmium telluride layer 22 and the back contact layer 24. Thus, the Te-rich surface of the cadmium telluride layer 22 can enhance the collection of current created by the device through lower resistivity between the cadmium telluride layer 20 and the back contact layer 24.

Copper can be applied to the exposed surface of the cadmium telluride layer 22 by any process. For example, copper can be sprayed or washed on the surface of the cadmium telluride layer 22 in a solution with a suitable solvent (e.g., methanol, water, acetate, or the like, or combinations thereof) followed by annealing. In particular embodiments, the copper may be supplied in the solution in the form of copper chloride. The annealing temperature is sufficient to allow diffusion of the copper ions into the cadmium telluride layer 22, such as from about 125° C. to about 300° C. (e.g. from about 150° C. to about 200° C.) for about 5 minutes to about 30 minutes, such as from about 10 to about 25 minutes.

However, since copper is more soluble in cadmium sulfide than cadmium telluride, the copper ions tend to migrate through the cadmium telluride layer 22 and diffuse into the cadmium sulfide layer 18 over time. Such a copper diffusion can degrade the performance of the resulting device by making the back contact more resistive. Also, the presence of copper in the cadmium sulfide layer 18 can make the layer less transparent to radiation energy and reduce the efficiency of the device. The thin film interlayer 20 can inhibit copper ions from migrating from the cadmium telluride layer 22 to the cadmium sulfide layer 18 by creating a chemical barrier to diffusion.

A back contact layer 24 is shown on the cadmium telluride layer 22. The back contact layer 24 generally serves as the back electrical contact, whereas the TCO layer 14 serves as the front electrical contact. The back contact layer 24 can be formed on, and in one embodiment is in direct contact with, the cadmium telluride layer 22. The back contact layer 24 is suitably made from one or more highly conductive materials, such as elemental nickel, chromium, copper, tin, aluminum, gold, silver, or technetium, or alloys or mixtures thereof. Additionally, the back contact layer 24 can be a single layer or can be a plurality of layers. In one particular embodiment, the back contact layer 24 can include graphite, such as a layer of carbon deposited on the p-layer followed by one or more layers of metal, such as the metals described above. The back contact layer 24, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 μm to about 10 μm in thickness, for example from about 1 μm to about 5 μm. A metal layer of the back contact, if used for or as part of the back contact layer 24, can be from about 0.1 μm to about 1 μm in thickness.

The encapsulating glass 26 is also shown in the exemplary cadmium telluride thin film photovoltaic device 10 of FIG. 1.

Other components (not shown) can be included in the exemplary device 10, such as bus bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor, such as a wire or bus bar, to direct the photovoltaically generated current to convenient locations for connection to a device or other system using the generated electricity. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 2:
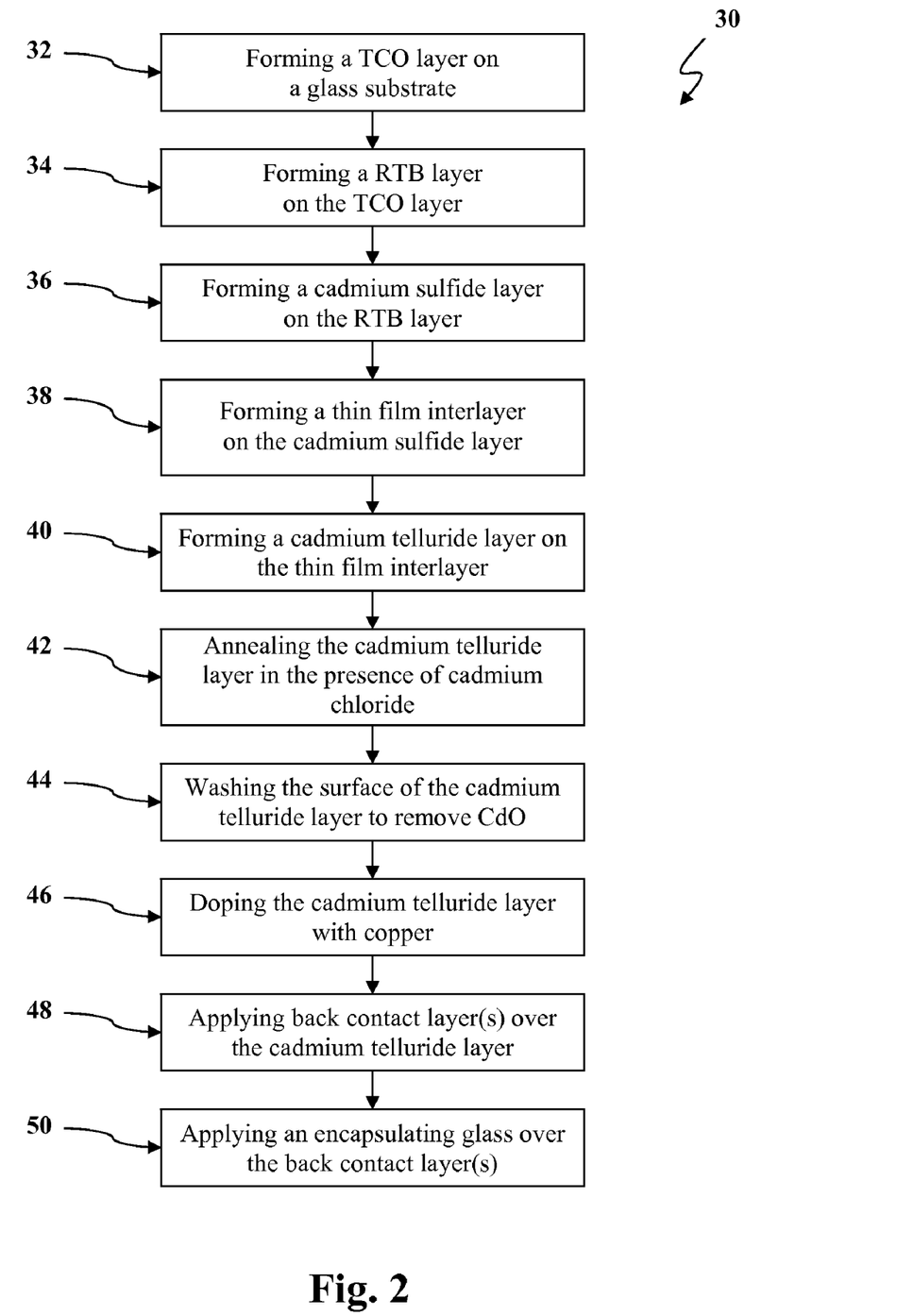
FIG. 2 shows a flow diagram of an exemplary method of manufacturing a photovoltaic device according to one embodiment of the present invention.

FIG. 2 shows a flow diagram of an exemplary method 30 of manufacturing a photovoltaic device according to one embodiment of the present invention. According to the exemplary method 30, a TCO layer is formed on a glass substrate at 32. At 34, a RTB layer is formed on the TCO layer. A cadmium sulfide layer is formed on the RTB layer at 36. A thin film interlayer is formed on the cadmium sulfide layer at 38. A cadmium telluride layer is formed on the thin film interlayer at 40, followed by annealing the cadmium telluride layer in the presence of cadmium chloride at 42 and washing the cadmium telluride layer to remove any CdO formed on the surface at 44. The cadmium telluride layer can be doped with copper at 46. At 48, back contact layer(s) can be applied over the cadmium telluride layer, and an encapsulating glass can be applied over the back contact layer at 50.

One of ordinary skill in the art should recognize that other processing and/or treatments can be included in the method 30. For instance, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

EXAMPLES

Experimental cadmium telluride thin film photovoltaic devices were manufactured having a thin film interlayer between the cadmium sulfide layer and the cadmium telluride layer. In each of these experimental devices, the method shown in FIG. 2 was generally followed.

Specifically, a tin oxide coated glass was purchased commercially under the name TEC 15 TCO from Pilkington North America Inc. (Toledo, Ohio) and used as a superstrate. A CdS layer was sputtered onto the superstrate to a thickness of 70 nm. A $SiO_2$ interlayer was then sputtered on the CdS layer to the desired thickness (e.g., 50 Å and 100 Å as discussed below). A CdTe layer was formed via close space sublimation to a thickness of 3 μm. A solution of $CdCl_2$ in methanol was sprayed on the CdTe layer followed by annealing for 20 minutes at 395° C. The CdTe layer was then etched with ethylenediamine (DAE) at a 50% concentration for 1 minute. A solution of copper acetate in methanol was sprayed onto the CdTe layer, followed by heating for 12 minutes at 170° C. A back contact layer was formed by screen printing a graphite paste, baking at 130° C. for 8 minutes, then sputtering a NiV/Al/NiV metal stack onto the graphic layer. Two samples were prepared with 0.5 $cm^2$ area cell patterns, and two samples were prepared as 12-12.5 $cm^2$ cell areas. The cells were interconnected into modules.

The set of experimental devices was prepared comparing two different thicknesses of amorphous silica interlayers: 50 angstroms (Å) and 100 Å, respectively. Results from the samples prepared as cells in this first set of experimental devices indicated that the amorphous silica interlayer had the effect of increasing open circuit voltage and decreasing fill factor. The decrease in fill factor is thought to be primarily due to an increase in the Roc. Specifically, the results showed high open circuit voltages around 841.5 mV (where a standard high open circuit is typically about 800 mV) though the fill factor increases as the $SiO_2$ interlayer thickness decreases from 10 nm to 5 nm. It is believed, however, that these initial results can be improved to achieve better fill factors in parallel to high voltage.

Results from the samples prepared as modules in this set of experimental devices indicated that the amorphous silica interlayer has the effect of increasing the open circuit voltage (Voc) and decreasing the fill factor through an increase in open circuit resistance (Roc). The results also showed that decreasing the thickness of the amorphous silica interlayer improved the fill factor while retaining voltage.

Thus, the amorphous silica interlayer between the cadmium sulfide layer and the cadmium telluride layer was shown to increase the device open circuit voltage in modules prepared from cells having amorphous silica interlayer between the cadmium sulfide layer and the cadmium telluride layer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A cadmium telluride thin film photovoltaic device, comprising:
    a glass superstrate;
    a transparent conductive oxide layer on the glass superstrate;
    an n-type layer on the transparent conductive oxide layer, wherein the n-type layer comprises cadmium sulfide;
    an oxide thin film interlayer on the n-type layer, wherein the oxide thin film consists of cadmium stannate, zinc stannate, or a combination thereof;
    a p-type layer on the thin film interlayer, wherein the p-type layer comprises cadmium telluride, and wherein the n-type layer and the p-type layer form a p-n heterojunction with the thin film interlayer positioned between the n-type layer and the p-type layer; and,
    a back contact on the p-type layer.

2. The cadmium telluride thin film photovoltaic device as in claim 1, wherein the thin film interlayer is configured to substantially prevent chemical diffusion between the cadmium telluride layer and the cadmium sulfide.

3. The cadmium telluride thin film photovoltaic device as in claim 1, wherein the thin film interlayer has a thickness from 10 nm to about 5 μm.

4. The cadmium telluride thin film photovoltaic device as in claim 1, wherein the oxide thin film interlayer has a thickness between about 1 nm and about 10 nm.

5. The cadmium telluride thin film photovoltaic device as in claim 1, wherein the oxide thin film interlayer has a thickness between about 1 nm and about 75 nm.

6. A method of manufacturing a cadmium telluride thin film photovoltaic device, comprising:
   forming an n-type layer on a transparent conductive oxide layer on a substrate, wherein the n-type layer comprises cadmium sulfide;
   forming an oxide thin film interlayer on the n-type layer, wherein the oxide thin film layer consists of cadmium stannate, zinc stannate, or a combination thereof; and,
   forming a p-type layer on the thin film interlayer, wherein the p-type layer comprises cadmium telluride, and wherein the n-type layer, the thin film interlayer, and the p-type layer form a p-n heterojunction.

7. The method as in claim 6, wherein the tin film interlayer is formed by sputtering, evaporation, chemical vapor deposition, or chemical bath deposition.

8. The cadmium telluride thin film photovoltaic device as in claim 1, wherein the oxide thin film interlayer consists of cadmium stannate.

9. The cadmium telluride thin film photovoltaic device as in claim 1, wherein the oxide thin film interlayer consists of zinc stannate.

10. The method as in claim 6, wherein the oxide thin film interlayer consists of cadmium stannate.

11. The method as in claim 6, wherein the oxide thin film interlayer consists of zinc stannate.

12. A cadmium telluride thin film photovoltaic device, comprising:
   a substrate;
   a transparent conductive oxide layer on the substrate;
   an n-type layer on the transparent conductive oxide layer, wherein the n-type layer comprises cadmium sulfide;
   an oxide thin film interlayer on the n-type layer, wherein the oxide thin film interlayer consists of an oxide of Zn—, Sn—, Te—, Mg—, Cd—, Ti—, Hf—, Li—, or Zr—, or combinations thereof;
   a p-type layer on the thin film interlayer, wherein the p-type layer comprises cadmium telluride, and wherein the n-type layer and the p-type layer form a p-n heterojunction with the thin film interlayer positioned between the n-type layer and the p-type layer; and,
   a back contact on the p-type layer.

13. The cadmium telluride thin film photovoltaic device as in claim 12, wherein the oxide thin film interlayer consists of zinc stannate.

14. The cadmium telluride thin film photovoltaic device as in claim 12, wherein the oxide thin film interlayer consists of zinc stannate.

\* \* \* \* \*

UNITED STATES PATENT AND TRADEMARK OFFICE
CERTIFICATE OF CORRECTION

| | | |
|---|---|---|
| PATENT NO. | : 8,247,683 B2 | Page 1 of 1 |
| APPLICATION NO. | : 12/639037 | |
| DATED | : August 21, 2012 | |
| INVENTOR(S) | : Jonathan Mack Frey et al. | |

It is certified that error appears in the above-identified patent and that said Letters Patent is hereby corrected as shown below:

Column 11, line 26, "...wherein the tin film" should read --wherein the thin film--

Column 12, line 26, "...consists of zinc stannate." should read --consists of cadmium stannate.--

Signed and Sealed this
Eighteenth Day of December, 2012

David J. Kappos
*Director of the United States Patent and Trademark Office*

UNITED STATES PATENT AND TRADEMARK OFFICE
CERTIFICATE OF CORRECTION

PATENT NO. : 8,247,683 B2
APPLICATION NO. : 12/639037
DATED : August 21, 2012
INVENTOR(S) : Jonathan Mack Frey et al.

Page 1 of 1

It is certified that error appears in the above-identified patent and that said Letters Patent is hereby corrected as shown below:

On the title page, item [75] Inventor Name: "Robert Gossmann" should be changed to
--Robert Gossman--

Signed and Sealed this
Fifth Day of March, 2013

Teresa Stanek Rea
*Acting Director of the United States Patent and Trademark Office*